(12) United States Patent
Hirano et al.

(10) Patent No.: US 10,370,763 B2
(45) Date of Patent: Aug. 6, 2019

(54) PLASMA PROCESSING APPARATUS

(71) Applicants: Takahiro Hirano, Miyagi (JP); Toshihiko Iwao, Miyagi (JP); Takaaki Kato, Miyagi (JP)

(72) Inventors: Takahiro Hirano, Miyagi (JP); Toshihiko Iwao, Miyagi (JP); Takaaki Kato, Miyagi (JP)

(73) Assignee: Tokyo Electron Limited, Tokyo (JP)

(*) Notice: Subject to any disclaimer, the term of this patent is extended or adjusted under 35 U.S.C. 154(b) by 309 days.

(21) Appl. No.: 15/131,409

(22) Filed: Apr. 18, 2016

(65) Prior Publication Data

US 2017/0298514 A1 Oct. 19, 2017

(51) Int. Cl.
| | | |
|---|---|---|
| *C23C 16/511* | (2006.01) | |
| *H01J 37/32* | (2006.01) | |
| *C23C 16/44* | (2006.01) | |
| *C23C 16/455* | (2006.01) | |
| *C23C 16/458* | (2006.01) | |

(52) U.S. Cl.
CPC ........ *C23C 16/511* (2013.01); *C23C 16/4404* (2013.01); *C23C 16/4584* (2013.01); *C23C 16/45538* (2013.01); *C23C 16/45551* (2013.01); *H01J 37/3222* (2013.01); *H01J 37/32192* (2013.01); *H01J 37/32238* (2013.01); *H01J 37/32899* (2013.01)

(58) Field of Classification Search
CPC ..... H01J 37/32192–32311; H05H 1/46; H05H 2001/4607; H05H 2001/4615; H05H 2001/4622; H05H 2001/463; C23C 16/511

USPC ............... 118/723 MW; 156/345.41
See application file for complete search history.

(56) References Cited

U.S. PATENT DOCUMENTS

| | | | | |
|---|---|---|---|---|
| 5,698,036 A | * | 12/1997 | Ishii ............... | C23C 16/511 |
| | | | | 118/723 MP |
| 2001/0036465 A1 | * | 11/2001 | Ishll ............... | H01J 37/32192 |
| | | | | 424/400 |
| 2002/0020498 A1 | * | 2/2002 | Ohmi .............. | H01J 37/32192 |
| | | | | 156/345.12 |

(Continued)

FOREIGN PATENT DOCUMENTS

| | | |
|---|---|---|
| CN | 1666322 A | 9/2005 |
| CN | 102953052 A | 3/2013 |

(Continued)

*Primary Examiner* — Rakesh K Dhingra
(74) *Attorney, Agent, or Firm* — Abelman, Frayne & Schwab

(57) ABSTRACT

Disclosed is a plasma processing apparatus that processes a processing target substrate using microwave plasma within a processing container. The plasma processing apparatus includes a placing table provided in the processing container, and configured to place the processing target substrate thereon; and an antenna provided above the placing table to face the placing table, and including a dielectric plate, the antenna being configured to radiate microwaves into the processing container through the dielectric plate to generate plasma of a processing gas supplied into the processing container. The dielectric plate includes a flat plate portion provided on a bottom surface of the antenna, and formed in a flat shape at least on a surface facing the placing table; and a rib formed on a surface of the flat plate portion that is opposite to the surface facing the placing table.

14 Claims, 10 Drawing Sheets

(56) References Cited

U.S. PATENT DOCUMENTS

| | | | |
|---|---|---|---|
| 2005/0139322 A1* | 6/2005 | Ishibashi | H01J 37/32192 156/345.48 |
| 2005/0172901 A1* | 8/2005 | Ishibashi | H01J 37/32192 118/723 I |
| 2007/0113788 A1* | 5/2007 | Nozawa | H01J 37/32192 118/723 MW |
| 2008/0142159 A1* | 6/2008 | Sasaki | C23C 16/4404 156/345.41 |
| 2015/0194637 A1* | 7/2015 | Ishikawa | C23C 16/345 438/792 |
| 2015/0211124 A1* | 7/2015 | Nozawa | H01J 37/32192 118/723 MW |
| 2015/0232993 A1* | 8/2015 | Iwao | C23C 16/45536 118/723 AN |

FOREIGN PATENT DOCUMENTS

| | | | |
|---|---|---|---|
| JP | 08-106994 A | | 4/1996 |
| JP | 10-214823 A | | 8/1998 |
| JP | 2003-282448 A | | 10/2003 |
| JP | 2009-132948 A | | 6/2009 |
| JP | 2014-027052 A | | 2/2014 |
| JP | WO2014030558 | * | 2/2014 |
| JP | 2015-018686 A | | 1/2015 |
| KR | 10-2011-0134284 | | 12/2011 |
| TW | 201210412 A | | 3/2012 |
| TW | 201326458 A | | 7/2013 |
| WO | 92/22085 A | | 12/1992 |

* cited by examiner

PLASMA PROCESSING APPARATUS

CROSS-REFERENCE TO RELATED APPLICATIONS

This application is based on and claims priority from Japanese Patent Application No. 2015-087747 filed on Apr. 22, 2015 with the Japan Patent Office, the disclosure of which is incorporated herein in its entirety by reference.

TECHNICAL FIELD

Various aspects and exemplary embodiments of the present disclosure relate to a plasma processing apparatus.

BACKGROUND

A microwave plasma processing apparatus known in the related art, which processes a processing target substrate using high-density plasma excited by microwaves. The microwave plasma processing apparatus radiates microwaves into the processing apparatus using, for example, a flat plate type antenna having a plurality of slots arranged therein. Thus, more uniform microwaves may be generated in the processing apparatus. Accordingly, the microwave plasma processing apparatus may generate more uniform high-density plasma by ionizing the gas supplied into the processing apparatus.

Further, a dielectric window made of a dielectric is provided on the bottom surface of the antenna. A rib is formed on the dielectric window to secure a mechanical strength. See, for example, Japanese Patent Laid-Open Publication No. 2015-018686.

SUMMARY

According to an aspect, the present disclosure provides a plasma processing apparatus that processes a processing target substrate using microwave plasma within a processing container. The plasma processing apparatus includes a placing table provided in the processing container, and configured to place the processing target substrate thereon; and an antenna provided above the placing table to face the placing table, and including a dielectric plate, the antenna being configured to radiate microwaves into the processing container through the dielectric plate to generate plasma of a processing gas supplied into the processing container. The dielectric plate includes a flat plate portion provided on a bottom surface of the antenna, and formed in a flat shape at least on a surface facing the placing table; and a rib formed on a surface of the flat plate portion that is opposite to the surface facing the placing table.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
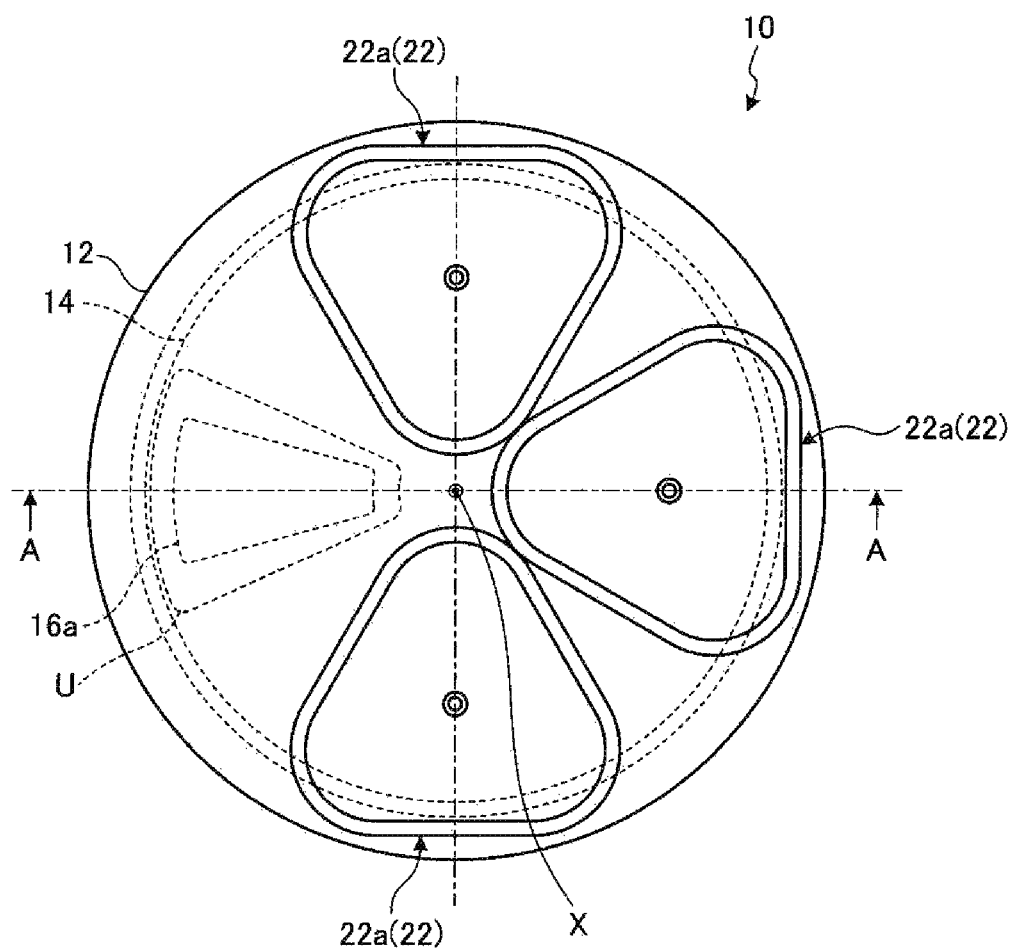
FIG. 1 is a schematic plan view illustrating a plasma processing apparatus.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the microwave plasma processing apparatus, it is considered to set the processing target substrate at a high temperature, or to shorten the distance between the antenna and the processing target substrate in order to enhance the film quality of the processing target substrate. However, when the temperature of the processing target substrate is set high, the base layer may be damaged by heat. Therefore, it is considered to enhance the film quality of the processing target substrate by shortening the distance between the antenna and the processing target substrate. However, in the microwave plasma processing apparatus described above, a rib is formed on the bottom surface of the dielectric window. Therefore, it is difficult to shorten the distance between the antenna and the processing target substrate.

In an exemplary embodiment, the present disclosure provides a plasma processing apparatus that processes a processing target substrate using microwave plasma within a processing container. The plasma processing apparatus includes: a placing table provided in the processing container, and configured to place the processing target substrate thereon; and an antenna provided above the placing table to face the placing table, and including a dielectric plate, the antenna being configured to radiate microwaves into the processing container through the dielectric plate to generate plasma of a processing gas supplied into the processing container. The dielectric plate includes a flat plate portion provided on a bottom surface of the antenna, and formed in a flat shape at least on a surface facing the placing table; and a rib formed on a surface of the flat plate portion that is opposite to the surface facing the placing table.

In an exemplary embodiment of the disclosed plasma processing apparatus, in the flat plate portion, the antenna may include a conductor plate that is provided in contact with the surface of the flat plate portion that is opposite to the surface facing the placing table, and configured to propagate the microwaves. The rib may be formed in a region where the conductor plate is not provided in the surface of the flat plate portion that is opposite to the surface facing the placing table.

In an exemplary embodiment of the disclosed plasma processing apparatus, the rib may be formed along a periphery of the surface of the flat plate portion that is opposite to the surface facing the placing table to protrude upwardly from the flat plate portion.

In an exemplary embodiment of the disclosed plasma processing apparatus, the rib is provided in the flat plate portion over the whole periphery of the surface of the flat plate portion that is opposite to the surface facing the placing table.

In an exemplary embodiment of the disclosed plasma processing apparatus, assuming that a wavelength of the microwaves in the dielectric plate is $\lambda$, a thickness of the flat plate portion may be within a range of $\lambda/8$ to $3\lambda/8$.

In an exemplary embodiment of the disclosed plasma processing apparatus, a height of the rib from the flat plate portion may be within a range of twice to four times the thickness of the flat plate portion.

In an exemplary embodiment of the disclosed plasma processing apparatus, a thickness of the rib may be within a range of once to 1.5 times the thickness of the flat plate portion.

In an exemplary embodiment of the disclosed plasma processing apparatus, the flat plate portion is subjected to a predetermined coating on the flat surface facing the placing table.

In an exemplary embodiment of the disclosed plasma processing apparatus, a distance between a bottom surface of the flat plate portion and the processing target substrate placed on the placing table may be within a range of three times to four times the thickness of the flat plate portion.

In an exemplary embodiment of the disclosed plasma processing apparatus, the dielectric plate may be made of alumina, quartz, aluminum nitride, silicon nitride, or yttrium oxide.

In an exemplary embodiment of the disclosed plasma processing apparatus, the placing table may be provided to be rotatable around an axis such that the processing target substrate is moved around the axis. Further, the processing container may be divided into a plurality of regions in a circumferential direction where the processing substrate is moved around the axis by the rotation of the placing table. Further, the antenna may radiate the microwaves into the processing container through the dielectric plate, in one of the plurality of regions, to generate plasma of a processing gas supplied into the processing container.

In an exemplary embodiment of the disclosed plasma processing apparatus, the antenna may have an equilateral triangular shape in cross-section when viewed in a direction along the axis.

According to various aspects and exemplary embodiments of the present disclosure, it is possible to shorten the distance between the antenna and the processing target substrate while securing the mechanical strength of the antenna.

Hereinafter, exemplary embodiments of the plasma processing apparatus disclosed herein will be described in detail with reference to the drawings. Further, the present disclosure is not limited to the exemplary embodiments disclosed herein. In addition, respective embodiments may be appropriately combined within a range that does not contradict the processing contents.

Exemplary Embodiment

[Plasma Processing Apparatus 10]

Figure 2:
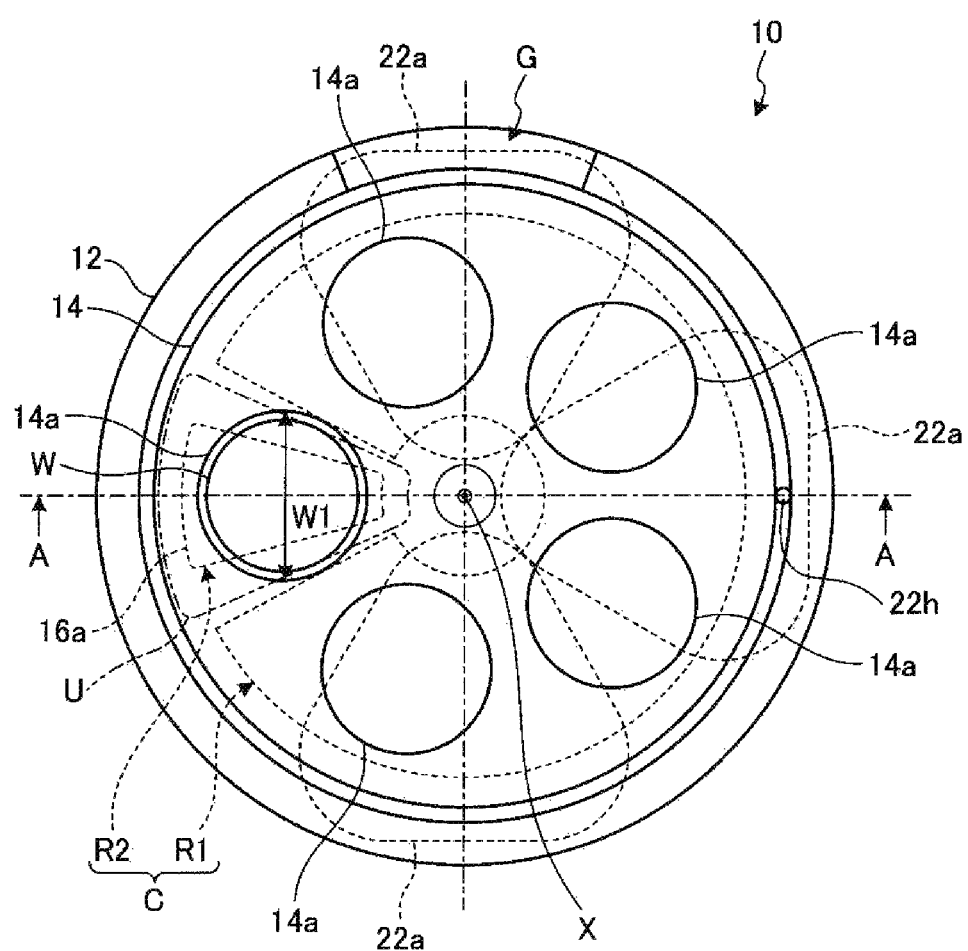
FIG. 2 is a plan view illustrating the plasma processing apparatus illustrated in FIG. 1 in a state where the upper portion of the processing container is removed therefrom.
Figure 3:
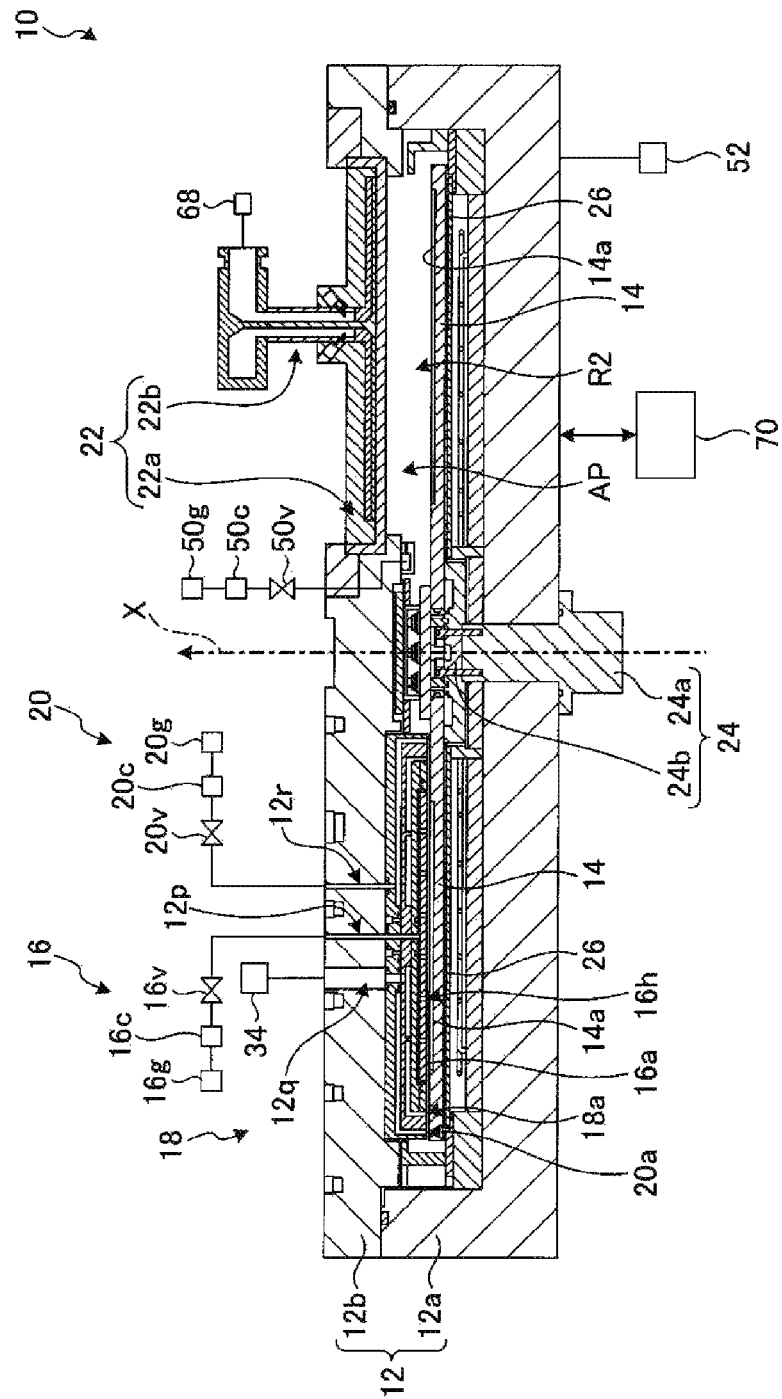
FIG. 3 is a cross-sectional view of the plasma processing apparatus, taken along line A-A as illustrated in FIGS. 1 and 2.
Figure 4:
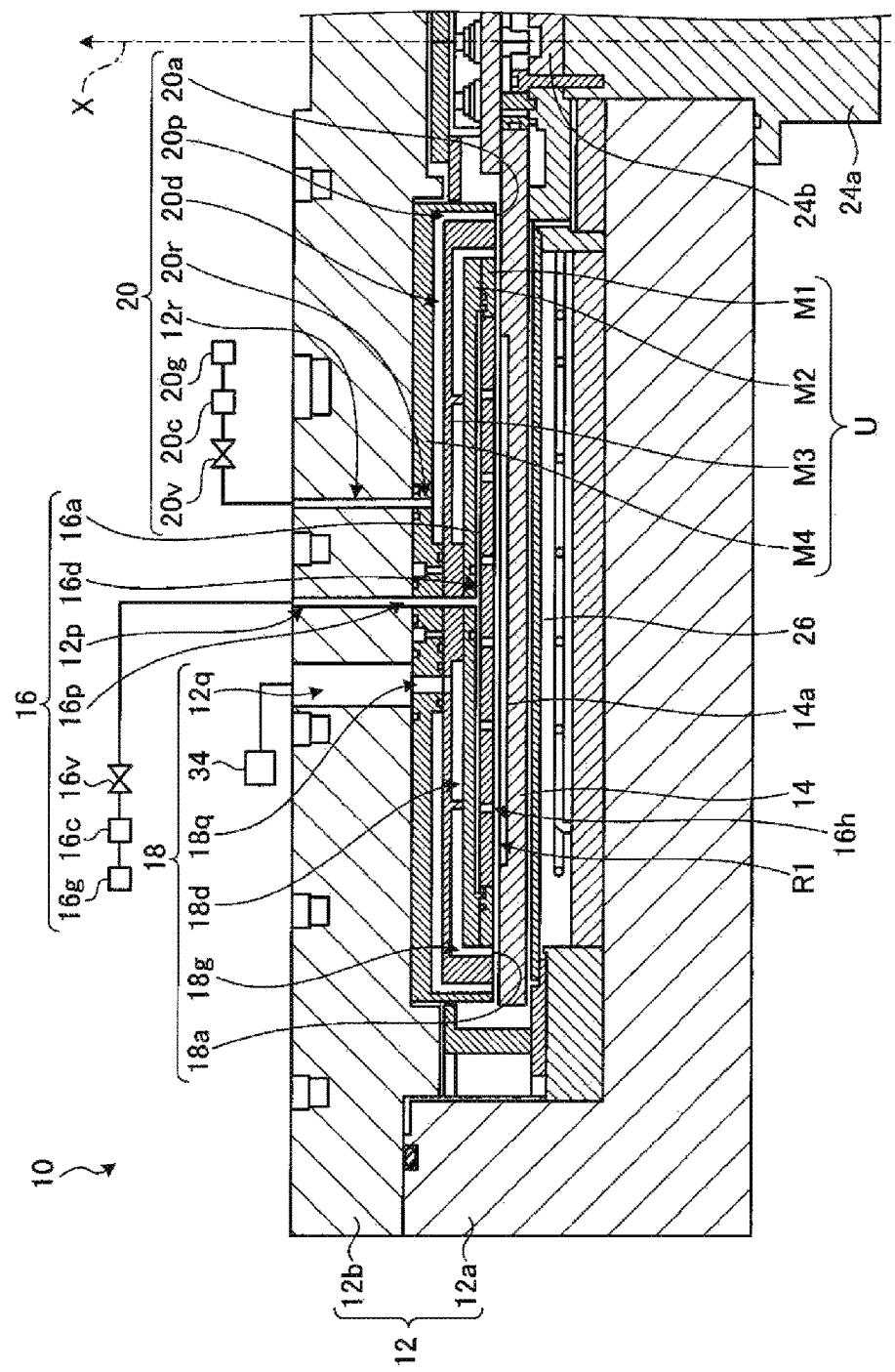
FIG. 4 is an enlarged cross-sectional view of the left portion of an axis X when viewed in FIG. 3.
Figure 5:
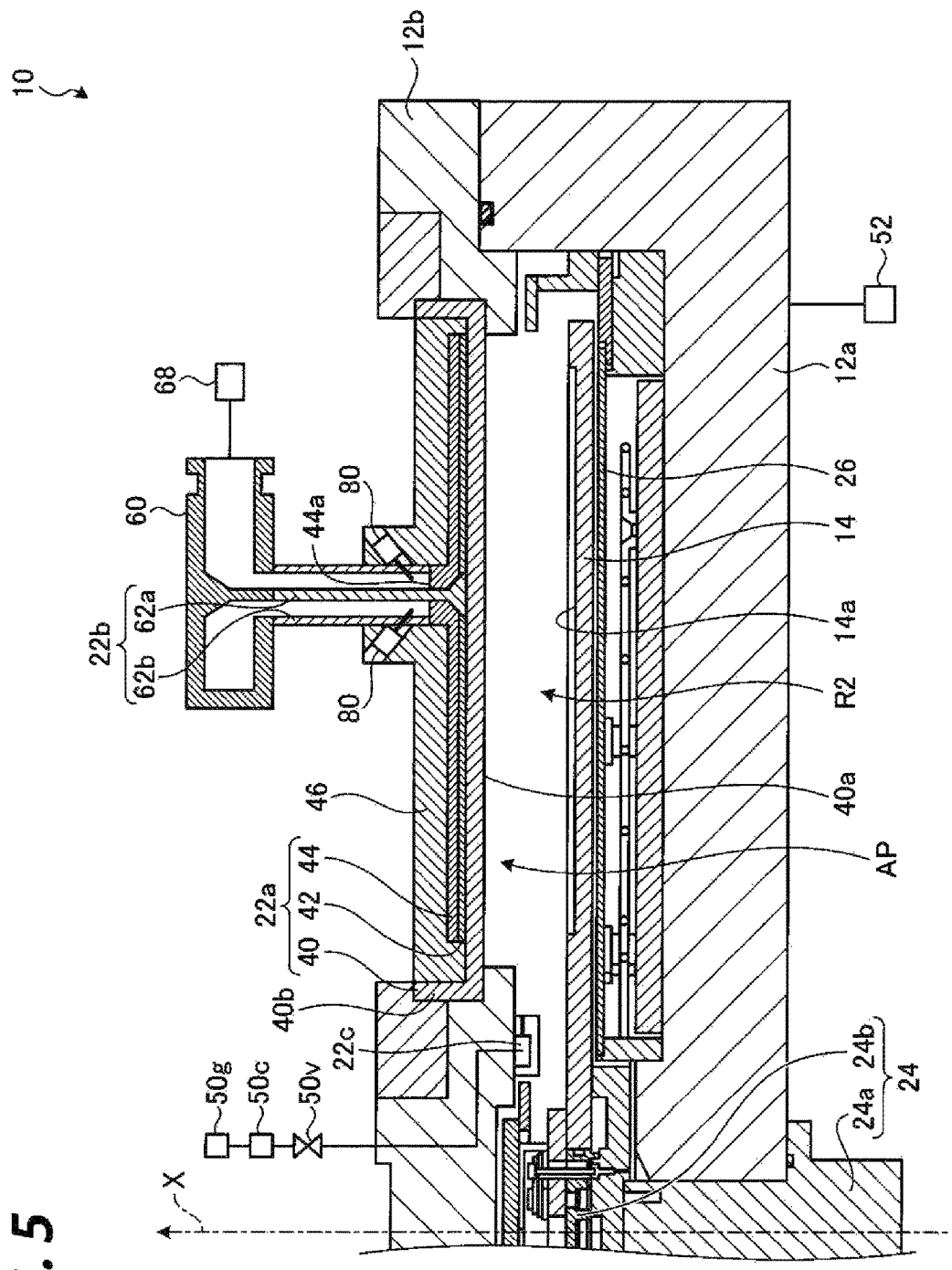
FIG. 5 is an enlarged cross-sectional view of the right portion of the axis X when viewed in FIG. 3.

FIG. 1 is a schematic plan view illustrating a plasma processing apparatus 10. FIG. 2 is a plan view illustrating the plasma processing apparatus 10 illustrated in FIG. 1 in a state where the upper member 12b of a processing container 12 is removed therefrom. FIG. 3 is a cross-sectional view of the plasma processing apparatus 10, taken along line A-A as illustrated in FIGS. 1 and 2. FIG. 4 is an enlarged cross-sectional view of the left portion of an axis X when viewed in FIG. 3. FIG. 5 is an enlarged cross-sectional view of the right portion of the axis X when viewed in FIG. 3. The plasma processing apparatus 10 illustrated in FIGS. 1 to 5 mainly includes a processing container 12, a placing table 14, a first gas supply section 16, an exhaust section 18, a second gas supply section 20, and a plasma generating unit 22. In the present exemplary embodiment, the plasma processing apparatus 10 is, for example, a semi-batch type substrate processing apparatus.

For example, as illustrated in FIG. 1, the processing container 12 is a substantially cylindrical container with an axis X as a central axis. The processing container 12 has a processing chamber C provided therein. The processing chamber C includes a unit U that is provided with an injection section 16a. The processing container 12 is made of a metal such as, for example, aluminum (Al). The inner surface of the aluminum is anodized or subjected to a plasma-resistant treatment such as, for example, yttrium oxide ($Y_2O_3$) spray treatment. The plasma processing apparatus 10 includes a plurality of plasma generating units 22 in the processing chamber 12. Each plasma generating unit 22 includes an antenna 22a in the upper portion of the processing chamber 12 to output microwaves. The plasma processing apparatus 10 illustrated in FIGS. 1 and 2 includes, for example, three antennas 22a. However, the number of antennas 22a provided in the plasma processing apparatus 10 is not limited to that illustrated in FIGS. 1 and 2, but may be appropriately varied.

For example, as illustrated in FIG. 2, the plasma processing apparatus 10 includes a placing table 14 having a plurality of placement regions 14a on the top surface thereof. The placing table 14 is a substantially disc-shaped member with the axis X as a central axis. On the top surface of the placing table 14, a plurality of placement regions 14a (five placement regions in the example of FIG. 2) are formed concentrically about the axis X such that a substrate W, which is an example of the processing target substrate, is placed in each placement region 14a. When a substrate W is placed in each placement region 14a and the placing table 14 is rotated, the placement region 14a supports the substrate W such that the substrate W is not dislocated. The placement region 14a is a substantially circular recess which is substantially the same as the shape of the substantially circular substrate W. The recess diameter W1 of the placement region 14a is substantially the same as the diameter of the substrate W to be placed in the placement region 14a. That is, the recess diameter W1 of the placement region 14a may be set such that the substrate W to be placed therein is fitted in the recess and is not moved from the fitted position by a centrifugal force even when the placing table 14 is rotated.

The plasma processing apparatus 10 includes a gate valve G in the outer periphery of the processing container 12 to carry the substrate W into the processing chamber C and carry the substrate W out of the processing chamber C through a conveyance device such as, for example, robot arm. Further, the plasma processing apparatus 10 includes an exhaust port 22h below the outer periphery of the placing table 14. The exhaust port 22h is connected with an exhaust device 52. The plasma processing apparatus 10 controls the operation of the exhaust device 52 such that the pressure in the processing chamber C is maintained at a desired pressure. In the present exemplary embodiment, the pressure in the processing chamber C is set within a range of, for example, 1 Torr to 5 Torr.

For example, as illustrated in FIG. 3, the processing container 12 includes a lower member 12a and an upper member 12b. The lower member 12a has a substantially cylindrical shape which is top-opened, and defines a recess including a sidewall and a bottom wall, which define the processing chamber C. The upper member 12b has a substantially cylindrical shape, and serves as a cover that closes the upper opening of the recess of the lower member 12a to define the processing chamber. An elastic sealing member such as, for example, an O-ring may be provided on the outer periphery between the lower member 12a and the upper member 12b to seal the processing chamber C.

The plasma processing apparatus 10 includes the placing table 14 inside the processing chamber C defined by the processing container 12. The placing table 14 is rotationally driven around the axis X by a driving mechanism 24. The driving mechanism 24 includes a driving device 24a such as, for example, a motor, and a rotary shaft 24b, and attached to the lower member 12a of the processing container 12.

The rotary shaft 24b has the axis X as its central axis, and extends to the inside of the processing chamber C. The rotary shaft 24b rotates around the axis X by a driving force transmitted from the driving device 24a. The central portion of the placing table 14 is supported by the rotary shaft 24b. Accordingly, the placing table 14 is rotated around the axis X according to the rotation of the rotary shaft 24b. Further, an elastic sealing member such as, an O-ring, may be provided between the lower member 12a of the processing container 12 and the driving mechanism 24 to seal the processing chamber C.

The plasma processing apparatus 10 includes a heater 26 below the placing table 14 inside the processing chamber C to heat the substrate W placed in the placement region 14a. Specifically, the heater 26 heats the placing table 14 so as to heat the substrate W placed on the placing table 14. The substrate W is carried into the processing chamber C through the gate valve G provided in the processing container 12 by a conveyance device such as, for example, a robot arm (not illustrated), and placed in the placement region 14a. Further, the substrate W is carried out of the processing chamber C through the gate valve G by the conveyance device.

For example, as illustrated in FIG. 2, the processing chamber C forms a first region R1 and a second region R2, which are arranged on the circumference about the axis X. The substrate W placed in the placement region 14a sequentially passes through the first region R1 and the second region R2 according to the rotation of the placing table 14.

For example, as illustrated in FIG. 4, in the plasma processing apparatus 10, the first gas supply section 16 is disposed above the first region R1 to face the top surface of the placing table 14. The first gas supply section 16 includes the injection section 16a. That is, among the regions included in the processing chamber C, the region facing the injection section 16a is the first region R1.

The injection section 16a includes a plurality of injection ports 16h. The first gas supply section 16 supplies a precursor gas to the first region R1 through the plurality of injection ports 16h. As the precursor gas is supplied to the first region R1, atoms or molecules of the precursor gas are chemically adsorbed onto the surface of the substrate passing through the first region R1. The precursor gas is, for example, dichlorosilane (DCS), monochlorosilane, or trichlorosilane.

An exhaust port 18a of the exhaust section 18 is provided above the first region R1 to face the top surface of the placing table 14. The exhaust port 18a is provided around the injection section 16a. The exhaust section 18 exhausts the gas in the processing chamber C through the exhaust port 18a by operation of an exhaust device 34 such as, for example, a vacuum pump.

An injection port 20a of the second gas supply section 20 is provided above the first region R1 to face the top surface of the placing table 14. The injection port 20a is provided around the exhaust port 18a. The second gas supply section 20 supplies a purge gas to the first region R1 through the injection port 20a. The purge gas supplied by the second gas supply section 20 is an inert gas such as, for example, argon (Ar). When the purge gas is injected to the surface of the substrate W, the excess atoms or molecules chemically adsorbed onto the substrate W (residue gas components) are removed from the substrate W. Accordingly, an atomic layer or a molecular layer formed of chemically-adsorbed atoms or molecules of the precursor gas is formed on the surface of the substrate W.

The plasma processing apparatus 10 injects the purge gas from the injection port 20a and exhausts the purge gas from the exhaust along the surface of the placing table 14. Thus, the plasma processing apparatus 10 suppresses the precursor gas supplied to the first region R1 from leaking out of the first region R1. Further, since the plasma processing apparatus 10 injects the purge gas from the injection port 20a and exhausts the purge gas from the exhaust port 18a along the surface of the placing table 14, a reaction gas or radicals of the reaction gas to be supplied to the second region R2 are suppressed from entering into the first region R1. That is, the plasma processing apparatus 10 separates the first region R1 and the second region R2 by the injection of the purge gas from the second gas supply section 20 and the exhaust of the purge gas from the exhaust section 18.

Further, the plasma processing apparatus 10 includes the unit U including the injection section 16a, the exhaust port 18a, and the injection port 20a. That is, the injection section 16a, the exhaust port 18a, and the injection port 20a are formed as a part constituting the unit U. For example, as illustrated in FIG. 4, the unit U has a structure in which a first member M1, a second member M2, a third member M3, and a fourth member M4 are sequentially stacked. The unit U is attached to the processing container 12 to come into contact with the bottom surface of the upper member 12b of the processing container 12.

For example, as illustrated in FIG. 4, the unit U includes a gas supply path 16p formed therein, which penetrates the second member M2 to the fourth member M4. The upper end of the gas supply path 16p is connected to a gas supply path 12p provided in the upper member 12b of the processing container 12. The gas supply path 12p is connected with a gas source 16g of the precursor gas via a valve 16v and a flow rate controller 16c such as, for example, a mass flow controller. The lower end of the gas supply path 16p is connected to a space 16d defined between the first member M1 and the second member M2. The space 16d is connected with the injection ports 16h of the injection section 16a provided in the first member M1.

The unit U includes a gas supply path 20r which penetrates the fourth member M4. The upper end of the gas supply path 20r is connected to a gas supply path 12r provided in the upper member 12b of the processing container 12. The gas supply path 12r is connected with the gas source 20g of the precursor gas via a valve 20v and a flow rate controller 20c such as, for example, a mass flow controller.

In the unit U, the lower end of the gas supply path 20r is connected to a space 20d defined between the bottom surface of the fourth member M4 and the top surface of the third member M3. Further, the fourth member M4 defines a recess that accommodates the first member M1 to the third member M3. A gap 20p is formed between the inner side surface of the fourth member M4 defining the recess and the outer side surface of the third member M3. The gap 20p is connected to the space 20d. The lower end of the gap 20p functions as the injection port 20a.

The unit U includes an exhaust path 18q formed therein, which penetrates the third member M3 and the fourth member M4. The upper end of the exhaust path 18q is connected to an exhaust path 12q provided in the upper member 12b of the processing container 12. The exhaust path 12q is connected to the exhaust device 34 such as, for example, a vacuum pump. The lower end of the exhaust path 18q is connected to a space 18d provided between the bottom surface of the third member M3 and the top surface of the second member M2.

The third member M3 includes a recess that accommodates the first member M1 and the second member M2. A gap 18g is formed between the inner side surface of the third member M3 defining the recess provided in the third member M3 and the outer side surfaces of the first member M1 and the second member M2. The space 18d is connected to the gap 18g. The lower end of the gap 18g functions as the exhaust port 18a. Since the plasma processing apparatus 10 injects the purge gas from the injection port 20a and exhausts the purge gas from the exhaust port 18a along the surface of the placing table 14, the precursor gas to be supplied to the first region R1 is suppressed from leaking out of the first region R1.

For example, as illustrated in FIG. 5, in the plasma processing apparatus 10, the plasma generating unit 22 is provided in an opening AP of the upper member 12b, which is provided above the second region R2, to face the top surface of the placing table 14. The plasma generating unit 22 includes an antenna 22a and a coaxial waveguide 22b that supplies microwaves to the antenna 22a. In the present exemplary embodiment, the upper member 12b includes, for example, three openings AP formed therein, and the plasma processing apparatus 10 includes, for example, three plasma generating units 22.

The plasma generating unit 22 supplies a reaction gas and microwaves to the second region R2 to generate plasma of the reaction gas in the second region R2. When a nitrogen-containing gas is used for the reaction gas, the plasma generating unit 22 nitrifies the atomic layer or the molecular layer chemically adsorbed onto the substrate W. The reaction gas may be a nitrogen-containing gas such as, for example, nitrogen ($N_2$) or ammonia ($NH_3$).

For example, as illustrated in FIG. 5, in the plasma generating unit 22, the antenna 22a is hermetically disposed to close the opening AP. The antenna 22a includes a top plate 40, a slot plate 42, and a slow-wave plate 44.

Figure 6:
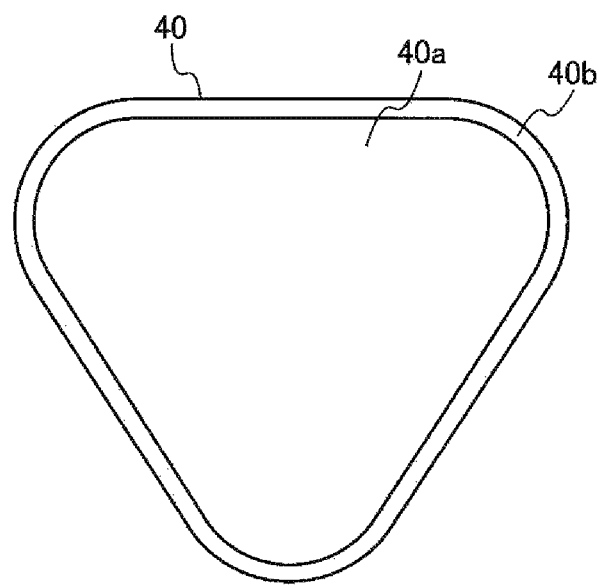
FIG. 6 is a plan view illustrating an exemplary schematic configuration of a top plate.
Figure 7:
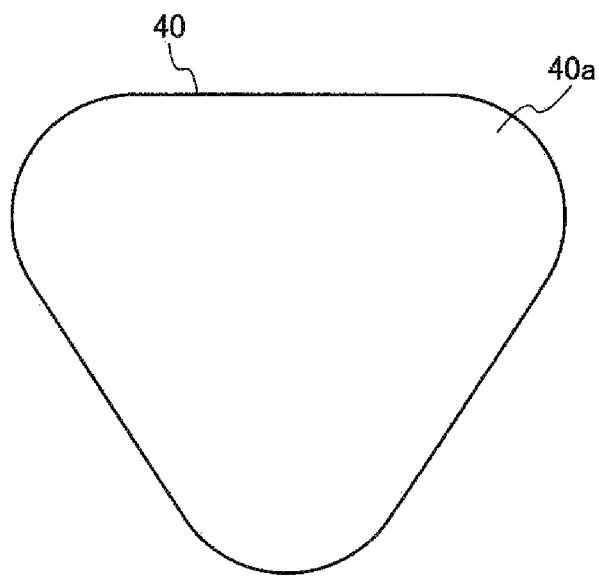
FIG. 7 is a plan view illustrating another exemplary schematic configuration of the top plate.

FIGS. 6 and 7 are views illustrating examples of the top plate 40. FIG. 6 illustrates an exemplary configuration of the top along the axis X plate 40 when viewed from the top along the axis X. FIG. 7 illustrates an exemplary configuration of the top plate 40 when viewed from the bottom along the axis X. The top plate 40 is formed of a dielectric, and includes a flat plate portion 40a and a rib 40b that projects upwardly from the flat plate portion 40a along the periphery of the flat plate portion 40a, for example as illustrated in FIGS. 6 and 7. In the present exemplary embodiment, the rib 40b is formed on the flat plate portion 40a over the whole periphery of the flat plate portion 40a.

In the present exemplary embodiment, the top plate 40 has, for example, a substantially equilateral triangular shape with rounded corners when viewed in the axis X direction, for example, as illustrated in FIGS. 6 and 7. In the present exemplary embodiment, the upper plate 40 is formed of, for example, alumina. Further, the top plate 40 may be formed of, in addition to alumina, for example, quartz, aluminum nitride, silicon nitride, or yttrium oxide. The top plate 40 is supported by the upper member 12b such that the bottom surface of the flat plate portion 40a is exposed from the opening AP formed in the upper member 12b of the processing container 12 to the second region R2.

In the top plate 40 of the present exemplary embodiment, at least a region of the bottom surface of the flat plate portion 40a facing the region through which the substrate W placed in the placement region 14a passes, is formed in a planar shape. In addition, the region of the bottom surface of the flat plate portion 40a formed in a planar shape is coated with, for example, $Al_2O_3$, $Y_2O_3$, or $YF_2$. The coating may be performed by, for example, spray or aerosol deposition. Therefore, it is possible to suppress any contamination generated when the material of the top plate 40 is attached to the surface of the substrate W during the processing of the substrate W. Further, in the present exemplary embodiment, since the bottom surface of the flat plate portion 40a is formed in a planar shape, the adhesion of the film to be coated on the bottom surface of the flat plate portion 40a, may be enhanced.

Figure 8:
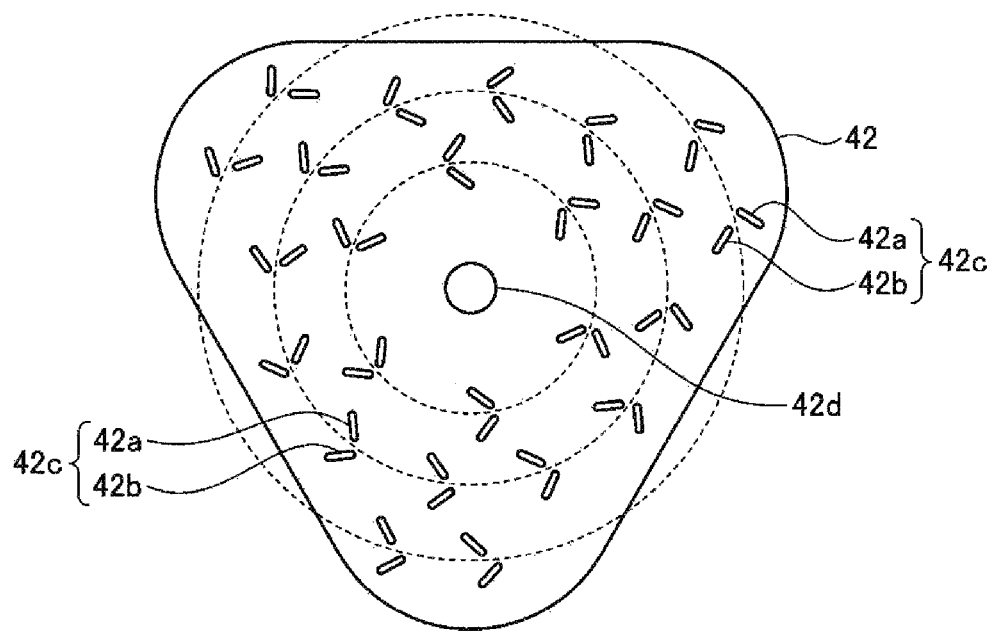
FIG. 8 is a plan view illustrating an exemplary schematic configuration of a slot plate.

The slot plate 42 is provided on the top plate 40. The slot plate 42 is disposed in a region surrounded by the rib 40b of the top plate 40. FIG. 8 is a view illustrating an example of the slot plate 42. The slot plate 42 is formed of a metal in a plate shape. For example, as illustrated in FIG. 8, the slot plate 42 has, for example, a substantially equilateral triangular shape with rounded corners when viewed in the axis X direction. For example, as illustrated in FIG. 8, the slot plate 42 includes a plurality of slot pairs 42c formed therein. Each slot pair 42c includes two slot holes 42a and 42b, which are elongated holes extending in a direction intersecting or orthogonal to each other. The plurality of slot pairs 42c are arranged in concentric circles which are radially spaced away from each other, in a circumferential direction in the plane of the slot plate 42. Further, the slot plate 42 includes an opening 42d formed therein to dispose the coaxial waveguide 22b. The slot plate 42 is an example of a conductive plate.

Figure 9:
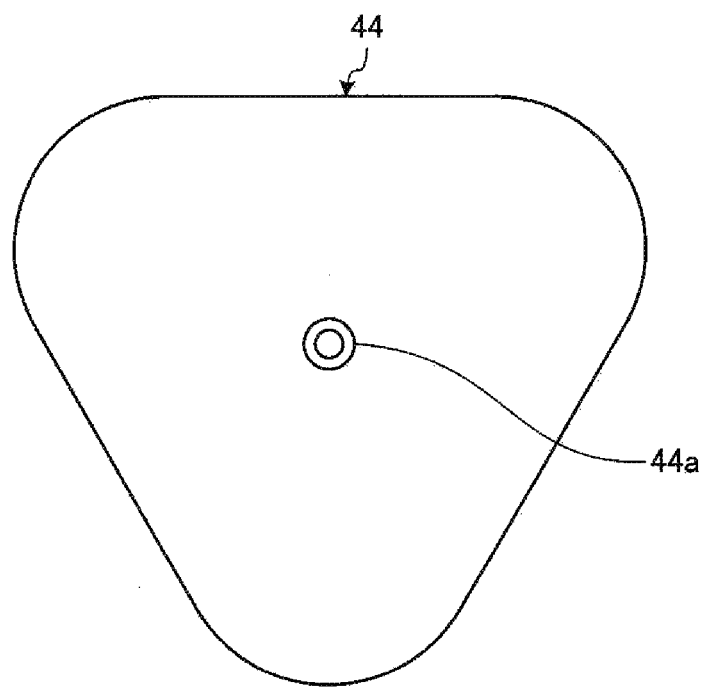
FIG. 9 is a plan view illustrating an exemplary schematic configuration of a slow-wave plate.

The slow-wave plate 44 is provided on the top plate 42. The slow-wave plate 44 is disposed in a region surrounded by a slow-wave plate 44b of the top plate 40. FIG. 9 is a view illustrating an example of the slow-wave plate 44. The slow-wave plate 44 is formed of a dielectric such as, for example, alumina. For example, as illustrated in FIG. 9, the slot plate 44 has, for example, a substantially equilateral triangular shape with rounded corners when viewed in the axis X direction. The slow-wave plate 44 includes a substantially cylindrical opening to dispose an outer conductor 62b of the coaxial waveguide 22b. In an inner diameter-sided end of the slow-wave plate 44 forming a periphery of the opening, an annular protrusion 44a is provided to protrude in a thickness direction of the slow-wave plate 44. The slow-wave plate 44 is attached on the slot plate 42 such that the protrusion 44a protrudes upwardly.

A cooling plate 46 is provided on the top surface of the slow-wave plate 44. The cooling plate 46 cools the antenna 22a via the slow-wave plate 44 by a coolant flowing through a flow path formed therein. The surface of the cooling plate 46 is made of metal. The cooling plate 46 is pressed against the top surface of the slow-wave plate 44 by a spring such as, for example, a spiral spring gasket (not illustrated), so that the bottom surface of the cooling plate 46 is brought into close contact with the top surface of the slow-wave plate 44. Accordingly, the antenna 22a may efficiently radiate heat through the cooling plate 46.

The coaxial waveguide 22b includes a substantially cylindrical hollow inner conductor 62a and a substantially cylindrical hollow outer conductor 62b. The inner conductor 62a penetrates through the opening of the slow-wave plate 44 and the opening of the slot plate 42 from the top of the antenna 22a. The outer conductor 62b is provided to surround the inner conductor 62a with a gap between the outer peripheral surface of the inner conductor 62a and the inner peripheral surface of the outer conductor 62b. The lower end of the outer conductor 62b is connected to the opening of the cooling plate 46. A plurality of stubs 80 are inserted between the inner conductor 62a and the outer conductor 62b, obliquely downwardly from the outer conductor 62b toward the inner conductor 62a. Controlling the insertion amount of each stub 80 may enable the control of the distribution of the microwaves radiated from the bottom of the top plate 40 to the second region R2.

The plasma processing apparatus 10 includes a waveguide 60 and a high frequency wave generator 68. The high frequency wave generator 68 generates high frequency waves included in a band of, for example, 1 MHz to 3 THz. In the exemplary embodiment, the high frequency wave generator 68 generates microwaves included in a band of 300 MHz to 3 THz (e.g., microwaves of 2.45 GHz). The microwaves of, for example, about 2.45 GHz generated by the high frequency wave generator 68 are propagated to the coaxial waveguide 22b through the waveguide 60, and propagated to the gap between the inner conductor 62a and the outer conductor 62b. Then, the microwaves propagated into the slow-wave plate 44 is propagated from the slot holes of the slot plate 42 to the top plate 40, and radiated from the top plate 40 to the second region R2.

In the second region R2, a reaction gas is supplied from a reaction gas supply section 22c. For example, a plurality of reaction gas supply sections 22c are provided at the inner side of the upper member 12b of the processing container 12 to extend around the opening AP, and injects the reaction gas toward the lower side of the top plate 40. Each reaction gas supply section 22c is connected with the gas source 50g of the reaction gas via a valve 50v and a flow rate controller 50c such as, for example, a mass flow controller.

The plasma generating unit 22 supplies the reaction gas to the second region R2 by the reaction gas supply sections 22c and radiates the microwaves to the second region R2 by the antenna 22a. Therefore, plasma of the reaction gas is generated in the second region R2.

Further, as illustrated in FIG. 3, the plasma processing apparatus 10 includes a controller 70 to control respective components of the plasma processing apparatus 10. The controller 70 may be a computer including a control device such as, for example, a central processing unit (CPU), a storage device such as, a memory, and an input/output device. The controller 70 controls respective components of the plasma processing apparatus 10 based on the operation of the CPU according to a control program stored in the memory.

For example, the controller 70 outputs a control signal to the driving device 24a to control the rotation speed of the placing table 14. Further, the controller 70 outputs a control signal to a power, which is connected to the heater 26, to control the temperature of the substrate W. Further, the controller 70 outputs a control signal to the valve 16v and the flow rate controller 16c to control the flow rate of the precursor gas. Further, controller 70 outputs a control signal to an exhaust device 34 to control the exhaust amount.

Further, the controller 70 outputs a control signal to the valve 20v and the flow rate controller 20c to control the flow rate of the purge gas. Further, controller 70 outputs a control signal to the exhaust device 68 to control the power of the microwaves. Further, the controller 70 outputs a control signal to the valve 50v and the flow rate controller 50c to control the flow rate of the reaction gas. Further, controller 70 outputs a control signal to an exhaust device 52 to control the exhaust amount from the exhaust port 22h.

[Shape of Top Plate 40]

In the plasma processing of the substrate W using the plasma processing apparatus 10, the inside of the processing container 12 is set at a pressure lower than the atmospheric pressure. Thus, the top plate 40 is pressurized by a pressure corresponding to a pressure difference between the atmospheric pressure and the pressure in the processing container 12. Accordingly, in the top plate 40, a rib may be provided on the top plate 40 in order to secure a strength against the pressure. In the plasma processing using the microwaves, when the distance between the antenna 22a and the substrate W is shorten, the amount of the radicals supplied to the substrate W is increased, and the quality of the film formed on the substrate W is enhanced. However, when a rib is provided on the placing table 14 side surface of the top plate 40 to secure the mechanical strength of the top plate 40, the rib makes it difficult to approximate the antenna 22a to the substrate W by its height. Thus, it is difficult to enhance the quality of the film formed on the substrate W.

Figure 10:
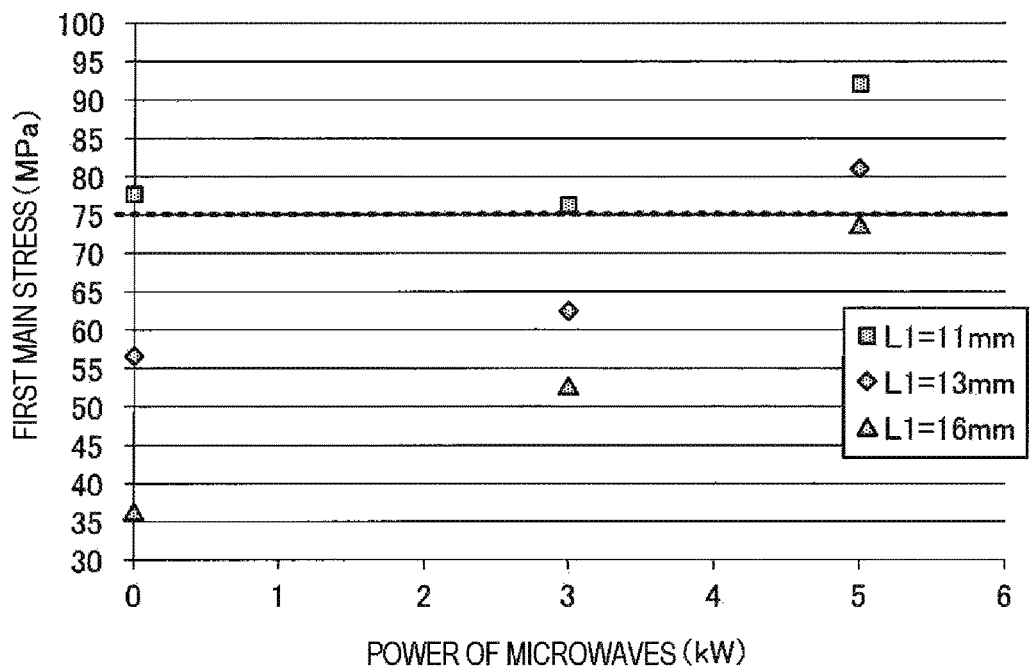
FIG. 10 is a view illustrating an example of a simulation result of a first main stress of the top plate which is not provided with a rib.

Accordingly, the present inventors have studied on using the top plate 40 which is not provided with a rib on the surface at the placing table 14 side. In a case where the plasma processing is performed using a plate type top plate which is not provided with a rib, a first main stress of the top plate was simulated. Accordingly, a simulation result was obtained as illustrated in FIG. 10. FIG. 10 is a view illustrating an example of the simulation result of the first main stress of the top plate which is not provided with a rib. FIG. 10 illustrates the simulation result of the first main stress of three top plates whose thicknesses L1 are 11 mm, 13 mm, and 16 mm, respectively, in a case of changing the power of the microwaves supplied from the antenna 22a. Further, in the simulation result illustrated in FIG. 10, alumina was used for the material of the top plates.

As is obvious from the result of FIG. 10, with respect to the top plates of all the thicknesses L1, as the power of the microwaves increases, the first main stress of the top plates increases. For the top plate having the thickness L1 of 11 mm or 13 mm, the first main stress in the case of supplying 5 kW of microwaves exceeded 75 MPa. For the top plate having the thickness L1 of 16 mm, the first main stress in the case of supplying 5 kW of microwaves was approximated to 75 MPa.

In the present exemplary embodiment, the upper limit of the first main stress in the case of supplying 5 kW of microwaves was set to 75 MPa, based on the past usage result of the top plate. Referring to the simulation result of FIG. 10, it has been found that, for the top plate having the thickness L1 of 11 mm or 13 mm, the first main stress in the case of supplying 5 kW of microwaves exceeded the upper limit. In addition, it has been found that, for the top plate having the thickness L1 of 16 mm, the first main stress in the case of supplying 5 kW of microwaves was approximated to 75 MPa, so that a margin was not obtained with respect to the upper limit. Therefore, it has been found that, in the case of using the plate type top plate which is not provided with a rib, the strength cannot be secured.

Next, descriptions will be made on a simulation result of the top plate which is provided with a rib. When a rib is provided on the placing table 14 side surface of the top plate 40, the rib makes it difficult to approximate the antenna 22a to the substrate W by its height. Therefore, in the present exemplary embodiment, for example, as illustrated in FIGS. 6 and 7, a top plate 40 which is provided with a rib over the whole periphery of a surface opposite to the placing table 14 side surface, is used.

Figure 11:
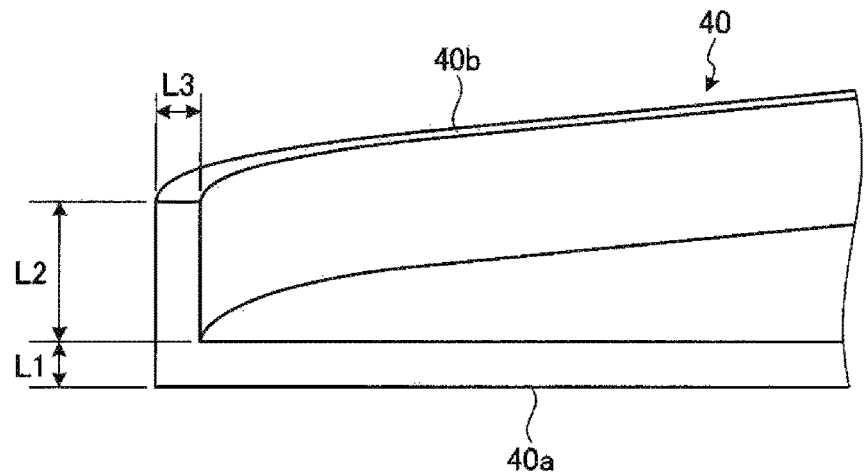
FIG. 11 is a view for explaining a height and a width of a rib.

Here, parameters used in the simulation will be described. FIG. 11 is a view for explaining a height and a width of the rib. As illustrated in FIG. 11, in the top plate 40, the thickness of the flat plate portion 40a is defined as L1, the height of the rib 40b from the flat plate portion 40a is defined as L2, and the width of the rib 40b is defined as L3.

Further, the flat plate portion 40a of the top plate 40 is disposed below the slot plate 42. Then, the microwaves radiated from the respective slot holes 42a and 42b formed in the slow-wave plate 42 are propagated through the top plate 40, and radiated from the top plate 40 to the second region R2. Here, in order to enhance the mechanical strength, it is considered to increase the thickness L1 of the top plate 40. However, when the thickness of the top plate 40 is increased, the microwaves radiated from the respective slot holes 42a and 42b are easily dispersed in the in-plane direction of the top plate 40, and standing waves of the microwaves are easily generated on the top plate 40. When the standing waves of the microwaves are generated, the microwaves may, in some cases, become stronger at positions different from the positions just below the slot holes 42a and 42b in the plane of the top plate 40. Thus, the microwaves have a distribution different from the arrangement of the slot holes 42a and 42b. Therefore, the controllability of the distribution of the microwaves is deteriorated. Accordingly, ignition failure of plasma or deviation of plasma distribution is caused. Therefore, it is also undesirable for the flat plate portion 40a to be excessively thick.

In the present exemplary embodiment, assuming the wavelength of the microwaves in the top plate 40 is $\lambda$, the thickness L1 of the flat plate portion 40a is preferably within a range of, for example, $\lambda/8$ to $3\lambda/8$ from the viewpoints of the mechanical strength and the controllability of the distribution of the microwaves. When the material of the top plate 40 is alumina, the thickness L1 of the flat plate portion 40a may be within a range of, for example, about 5 mm to 15 mm with respect to the microwaves of 2.45 GHz. From the controllability of the distribution of the microwaves, the thickness L1 of the flat plate portion 40a is more preferably $\lambda/4$. When the material of the top plate 40 is alumina, the wavelength of the microwaves of 2.45 GHz in the top plate 40 is about 40 mm. Therefore, from the controllability of the distribution of the microwaves, the thickness L1 of the flat plate portion 40a is preferably about 10 mm. However, in consideration of the mechanical strength, it is considered that the margin of the strength is small with respect to the thickness of about 10 mm. Thus, in the following, a simulation was performed by setting the thickness L1 of the flat plate 40a to 13 mm.

Figure 12:
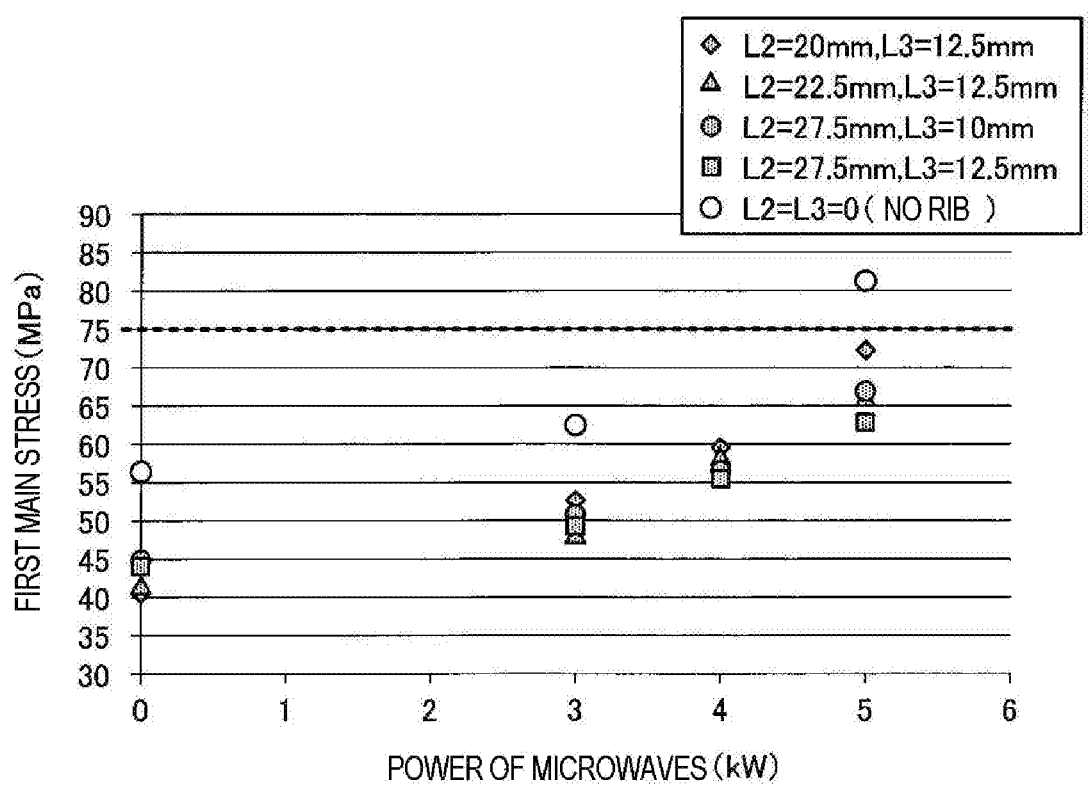
FIG. 12 is a view illustrating an example of a simulation result of the top plate which is provided with a rib.

FIG. 12 is a view illustrating an example of a simulation result of the top plate 40 which is provided with a rib. Further, in the simulation result illustrated in FIG. 12, alumina was used for the material of the top plate 40.

As is obvious from the result of FIG. 12, as the height L2 of the rib 40b is increased, the increase in the first main stress is suppressed with respect to the increase in the intensity of the microwaves. However, when the height L2 of the rib 40b is too high, the stress tends to increasingly concentrate on the connecting portion of the rib 40b and the flat plate portion 40a. Thus, the height L2 of the rib 40b may be within a predetermined range, for example, within a range of twice to four times the thickness L1 of the flat plate portion 40a. In the present exemplary embodiment, the height L2 of the rib 40b may be within a range of, for example, 20 mm to 40 mm.

Further, as is obvious from the result of FIG. 12, as the width L3 of the rib 40b is increased, the increase in the first main stress is suppressed with respect to the increase in the intensity of the microwaves. However, when the width L3 of the rib 40b is too wide, the area of the flat plate portion 40a for arranging the slot plate 42 or the slow-wave plate 44 becomes narrow. Thus, the width L3 of the rib 40b may be within a predetermined range, for example, within a range of once to 1.5 times the thickness L1 of the flat plate portion 40a. In the present exemplary embodiment, the width L3 of the rib 40b may be within a range of, for example, 10 mm to 15 mm.

As is obvious from FIG. 12, in the simulation, it was confirmed that the first main stress generated in the top plate 40 could be suppressed up to 62.9 MPa by setting the thickness L1 of the flat plate 40a to 13 mm, the height L2 of the rib 40b to 27.5 mm, and the width L3 of the rib 40b to 12.5 mm.

Therefore, in the present exemplary embodiment, since the top plate 40 which is provided with a rib on a surface that is opposite to the surface at the placing table 14 side, for example, as illustrated in FIGS. 5 to 7, is used, the first main stress generated in the top plate 40 may be suppressed to a predetermined value or less, even though a rib is not provided on the surface at the placing table 14 side. Accordingly, the distance between the antenna 22a and the substrate W may be shortened.

For example, in a conventional plasma processing apparatus 10 using a top plate 40 which is provided with a rib on its bottom surface, the distance from the bottom surface of the top plate 40 in a portion other than the rib to the substrate W was 67 mm. On the contrary, in the plasma processing apparatus 10 of the present exemplary embodiment, the distance from the bottom surface of the top plate 40 to the substrate W could be shorten to 45.7 mm. That is, in the plasma processing apparatus 10 of the present exemplary embodiment, the distance from the top plate 40 to the substrate W may be shorten by 21.3 mm, as compared with the conventional plasma processing apparatus 10.

As such, the radicals generated near the antenna 22a more easily reach the substrate W by shortening the distance between the antenna 22a and the substrate W. Therefore, the amount of the radicals supplied to the substrate W may be increased, and the film quality of the substrate W may be enhanced even at a lower processing temperature.

Further, when the distance between the top plate 40 and the substrate W is too short, a charge-up damage occurs to the substrate W. In the test, when the distance between the bottom surface of the top plate 40 and the substrate W is less than 30 mm, the charge-up damage occurred to the substrate W. Thus, it is also undesirable for the distance between the antenna 22a and the substrate W to be too short. Thus, the distance between the antenna 22a and the substrate W may be within a predetermined range, for example, within a range of three times to four times the thickness L1 of the flat plate portion 40a. In the present exemplary embodiment, the distance between the antenna 22a and the substrate W may be within a range of, for example, 30 mm to 40 mm.

The exemplary embodiment has been described. According to the plasma processing apparatus 10 of the present exemplary embodiment, the film quality of the substrate W may be enhanced. Particularly, according to the plasma processing apparatus 10 of the present exemplary embodiment, since the bottom of the top plate 40 can be made flat while maintaining the thickness L1 of the top plate 40 on the bottom surface of the antenna 22a to 3λ/8 or less, the controllability of the distribution of the microwaves in a region where plasma is generated, may be enhanced, and at the same time, the amount of the radicals to be supplied to the substrate may be increased.

Further, the disclosed technique is not limited to the above-described exemplary embodiment, and various modifications may be made within the scope of the disclosure.

For example, in the above-described exemplary embodiment, as the antenna 22a, the antenna 22a having a substantially equilateral triangular shape in cross-section when viewed in the direction along the axis X, was used, but the disclosed technique is not limited thereto. In another exemplary embodiment, the shape of the antenna 22a when viewed in the direction along the axis X, may be a shape other than the substantially equilateral triangular shape, for example, a substantially circular shape or a polygonal shape.

Further, in the above-described exemplary embodiment, the plasma processing apparatus 10 was exemplified by a semi-batch type substrate processing apparatus. However, the disclosed technique is not limited thereto. For example, the top plate 40 may be also used in a single type plasma processing apparatus 10.

Further, in the above-described exemplary embodiment, the top plate 40 is provided with the rib 40b over the whole periphery of the flat plate portion 40a. However, the disclosed technique is not limited thereto. For example, the rib 40b may not be provided in some sections in the periphery of the flat plate portion 40a. Further, in a case where the shape of the top plate 40 when viewed in the direction along the axis X is a substantially equilateral triangle, the stress tends to easily concentrate on corner parts. Thus, even in a case where the rib 40b is not provided over the whole periphery of the flat plate portion 40a, it is desirable that the rib 40b is provided in the corner parts. Further, the rib 40b may be provided in a portion other than the periphery of the flat plate portion 40a.

Further, the rib 40b only needs to be provided on the top surface of the flat plate portion 40a (a surface at a side opposite to the surface at the side facing the placing table 14), and does not need to be provided in the periphery of the top surface of the flat plate portion 40a. However, in this case, it is desirable that the rib 40b is provided in a region other than the region where the slot plate 42 is disposed, on the top surface of the flat plate portion 40a.

Figure 13:
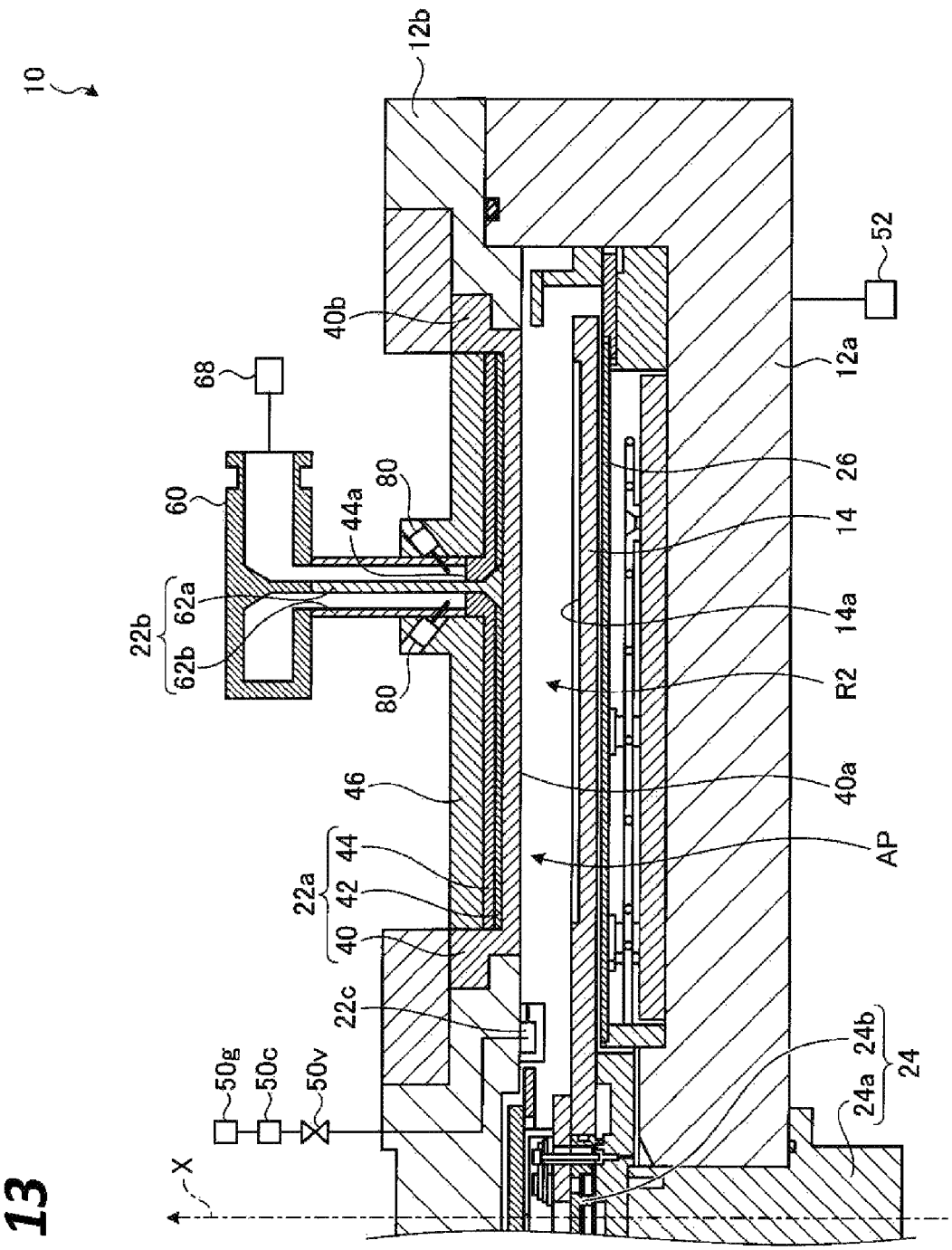
FIG. 13 is an enlarged cross-sectional view illustrating another exemplary antenna.

Further, in the above-described exemplary embodiment, the rib 40b of the top plate 40 protrudes from the flat plate portion 40a toward a side opposite to the surface at the side facing the placing table 14, along the periphery of the flat plate portion 40a, but the disclosed technique is not limited thereto. For example, as illustrated in FIG. 13, the rib 40b may protrude from the flat plate portion 40a toward a side opposite to the surface at the side facing the placing table 14, along the periphery of the flat plate portion 40a, and protrude outwardly along the direction substantially in parallel with the surface of the flat plate portion 40a. Accordingly, the whole antenna 22a may be brought closer to the substrate W while maintaining the mechanical strength of the top plate 40.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus that processes a processing target substrate using microwave plasma comprising:
a processing container including a lower member which surrounds a processing space for processing the substrate and a removable upper member,
wherein the removable upper member serves as a cover of the lower member;
a placing table provided in the processing container, and configured to place the processing target substrate thereon; and
an antenna provided above the placing table to face the placing table, and including a dielectric plate, the antenna being configured to radiate microwaves into the processing container through the dielectric plate to generate plasma of a processing gas supplied into the processing container,
wherein the dielectric plate includes:
a flat plate portion provided on a bottom surface of the antenna, and formed in a flat shape at least on a surface facing the placing table; and
a rib formed along a peripheral edge of a surface of the flat plate portion that is opposite to the surface facing the placing table to protrude upwardly from the flat plate portion, the antenna being supported on the upper member of the processing container by the flat plate portion and the rib, and
the antenna further includes a conductor plate that is provided on the surface of the flat plate portion that is opposite to the surface facing the placing table while being surrounded by the rib and configured to propagate the microwaves.

2. The plasma processing apparatus of claim 1, wherein the rib is provided in the flat plate portion over the whole peripheral edge of the surface of the flat plate portion that is opposite to the surface facing the placing table.

3. The plasma processing apparatus of claim 1, wherein, assuming that a wavelength of the microwaves in the dielectric plate is λ, a thickness of the flat plate portion is within a range of λ/8 to 3λ/8.

4. The plasma processing apparatus of claim 1, wherein a height of the rib from the flat plate portion is within a range of twice to four times the thickness of the flat plate portion.

5. The plasma processing apparatus of claim 1, wherein a thickness of the rib is within a range of one to 1.5 times the thickness of the flat plate portion.

6. The plasma processing apparatus of claim 1, wherein the flat plate portion is subjected to a predetermined coating on the surface facing the placing table.

7. The plasma processing apparatus of claim 1, wherein a distance between a bottom surface of the flat plate portion and the processing target substrate placed on the placing table is within a range of three times to four times the thickness of the flat plate portion.

8. The plasma processing apparatus of claim 1, wherein the dielectric plate is made of alumina, quartz, aluminum nitride, silicon nitride, or yttrium oxide.

9. The plasma processing apparatus of claim 1, wherein the placing table is provided to be rotatable around an axis such that the processing target substrate is moved around the axis, the processing container is divided into a plurality of regions in a circumferential direction where the processing substrate is moved around the axis by the rotation of the placing table, and the antenna radiates the microwaves into the processing container through the dielectric plate, in one of the plurality of regions, to generate plasma of a processing gas supplied into the processing container.

10. The plasma processing apparatus of claim 9, wherein the antenna has an equilateral triangular shape in cross-section when viewed in a direction along the axis.

11. The plasma processing apparatus of claim 1, wherein the surface of the flat plate portion facing the placing table is coated with $Al_2O_3$, $Y_2O_3$, or $YF_2$.

12. The plasma processing apparatus of claim 1, wherein when the dielectric plate is made of alumina, a thickness of the flat plate portion is within a range of about 5 mm to about 15 mm with respect to the microwaves.

13. The plasma processing apparatus of claim 1, wherein the antenna further includes a slow-wave plate that is provided on a top surface of the conductor plate while being surrounded by the rib and configured to propagate the microwaves.

14. The plasma processing apparatus of claim 13, wherein the antenna further includes a cooling plate that is provided on a top surface of the slow-wave plate while being surrounded by the rib and configured to cool the antenna.

* * * * *